(12) United States Patent
Nishimura et al.

(10) Patent No.: US 9,148,971 B2
(45) Date of Patent: Sep. 29, 2015

(54) COMPONENT BUILT-IN MODULE, ELECTRONIC DEVICE INCLUDING SAME, AND METHOD FOR MANUFACTURING COMPONENT BUILT-IN MODULE

(75) Inventors: Nozomu Nishimura, Tokyo (JP); Nobuhiro Mikami, Tokyo (JP)

(73) Assignee: LENOVO INNOVATIONS LIMITED (HONG KONG), Quarry Bay (HK)

( * ) Notice: Subject to any disclaimer, the term of this patent is extended or adjusted under 35 U.S.C. 154(b) by 348 days.

(21) Appl. No.: 13/824,479

(22) PCT Filed: Jul. 8, 2011

(86) PCT No.: PCT/JP2011/065700
§ 371 (c)(1),
(2), (4) Date: Mar. 18, 2013

(87) PCT Pub. No.: WO2012/049895
PCT Pub. Date: Apr. 19, 2012

(65) Prior Publication Data
US 2013/0176689 A1    Jul. 11, 2013

(30) Foreign Application Priority Data
Oct. 15, 2010  (JP) ................ P2010-232321

(51) Int. Cl.
*H05K 7/02*    (2006.01)
*H05K 3/28*    (2006.01)
*H01L 23/31*   (2006.01)
*H01L 21/56*   (2006.01)
*H05K 3/30*    (2006.01)

(52) U.S. Cl.
CPC ............. *H05K 7/02* (2013.01); *H01L 21/561* (2013.01); *H01L 21/565* (2013.01); *H01L 23/3121* (2013.01); *H05K 3/284* (2013.01); *H05K 3/305* (2013.01); *H01L 2224/16225* (2013.01); *H05K 2201/2009* (2013.01); *H05K 2201/2018* (2013.01); *H05K 2203/1316* (2013.01); *Y10T 29/4913* (2015.01)

(58) Field of Classification Search
CPC . H01L 21/561; H01L 21/565; H01L 23/3121; H05K 3/284; H05K 3/305
See application file for complete search history.

(56) References Cited

U.S. PATENT DOCUMENTS

2010/0155111 A1*  6/2010  Ono ........................... 174/255

FOREIGN PATENT DOCUMENTS

| JP | H02079450 A | 3/1990 |
|---|---|---|
| JP | 2003-037861 A | 2/2003 |
| JP | 2010166025 A | 7/2010 |
| WO | 02069251 A1 | 9/2002 |

OTHER PUBLICATIONS

The international search report for PCT/JP2011/065700 mailed on Aug. 16, 2011.

* cited by examiner

*Primary Examiner* — Hoa C Nguyen
*Assistant Examiner* — Keith Depew (57) ABSTRACT

A component built-in module of the present invention includes: a substrate which includes a top surface and a bottom surface; a plurality of electronic components which are mounted on the top surface of the substrate; a resin which seals the top surface of the substrate; and a reinforcing plate which is bonded to the bottom surface of the substrate. The reinforcing plate and the resin are bonded to each other.

2 Claims, 7 Drawing Sheets

COMPONENT BUILT-IN MODULE, ELECTRONIC DEVICE INCLUDING SAME, AND METHOD FOR MANUFACTURING COMPONENT BUILT-IN MODULE

This application is a National Stage Entry of PCT/JP2011/065700 filed Jul. 8, 2011, which claims priority from Japanese Patent Application 2010-232321 filed Oct. 15, 2010, the contents of all of which are incorporated herein by reference, in their entirety.

TECHNICAL FIELD

The present invention relates to a component built-in module in which a substrate having a plurality of electronic components mounted thereon is sealed with a resin, an electronic device including it, and a method for manufacturing a component built-in module.

BACKGROUND ART

For example, an electronic device such as a mobile phone includes a casing including an upper casing and a lower casing each composed of a synthetic resin, a plurality of component built-in modules that each have a plurality of electronic components mounted thereon and that are accommodated within the casing, a display, and a battery.

Meanwhile, with the recent full scale arrival of an ubiquitous network society there has been an increasing demand for downsizing and low-profiling of electronic devices. With a structure such as one seen in a mobile phone in which components including a plurality of component built-in modules, a display, and a battery are accommodated within a preliminarily prepared casing, it is becoming difficult to realize further low-profiling.

On the other hand, Patent Document 1 discloses a configuration in which, in at least a part of a resin casing including an upper casing and a lower casing, there is a built-in and sealed component built-in module having an electronic component mounted on a wiring substrate. In this Patent Document 1, by having at least one of several component built-in modules built into the resin casing, the space inside the casing can be reduced and further low-profiling can be achieved.

Patent Document 2 discloses a structure that enables low-profiling by sealing one surface of a substrate with an electronic component mounted thereon, and treating one surface (bottom surface) of a component built-in module as a substrate and the other surface (top surface) as a resin sealing surface.

PRIOR ART DOCUMENTS

Patent Documents

[Patent Document 1] Japanese Unexamined Patent Application, First Publication No. 2003-37861
[Patent Document 2] PCT International Patent Publication No. WO 2002/069251

SUMMARY OF THE INVENTION

Problem to be Solved by the Invention

However, in the structure disclosed in Patent Document 1, a sealing resin is formed on the top side and the bottom side, that is, one surface side and the other surface side of the substrate, and as a result, the thickness of the casing with the built in and sealed substrate increases.

In a structure that achieves low-profiling by sealing one side of a substrate with a resin in a manner similar to that disclosed in Patent Document 2, it is difficult to ensure bonding between the substrate and the sealing resin. Consequently, the substrate and the resin may be separated from each other in some cases.

The present invention has been achieved in consideration of the above circumstances. An exemplary object of the present invention is to provide a component built-in module which achieves low-profiling while being capable of preventing separation between a substrate and a resin, an electronic device including it, and a method for manufacturing a component built-in module.

Means for Solving the Problem

In order to achieve the above object, the present invention provides the following measures.

A component built-in module according to the present invention includes: a substrate which includes a top surface and a bottom surface; a plurality of electronic components which are mounted on the top surface of the substrate; a resin which seals the top surface of the substrate; and a reinforcing plate which is bonded to the bottom surface of the substrate. The reinforcing plate and the resin are bonded to each other.

In the component built-in module of the present invention, the reinforcing plate may include a first surface, a second surface on an opposite side to the first surface, and an opening part which passes through from the first surface to the second surface. One part of the substrate may be a corresponding part which corresponds to the opening part. The corresponding part may engage with the opening part from a side of the first surface, and the bottom surface of the substrate at the corresponding part is arranged flush with the second surface of the reinforcing plate.

In the component built-in module of the present invention, the electronic components may be mounted at least on the top surface of the substrate at the corresponding part.

In the component built-in module of the present invention, the reinforcing plate may be formed with use of a resin of same type as the resin which seals the top surface of the substrate.

In the component built-in module of the present invention, the reinforcing plate may be formed by coating a metal material with a resin of same type as the resin which seals the top surface of the substrate.

An electronic device of the present invention includes the above component built-in module.

In the electronic device of the present invention, the component built-in module may be incorporated into at least one part of a casing of the electronic device.

A method of the present invention for manufacturing a component built-in module, includes the steps of: mounting a plurality of electronic components on a top surface of a substrate; bonding a reinforcing plate to a bottom surface of the substrate; and sealing the top surface of the substrate with a resin.

Effect of the Invention

In the component built-in module, the electronic device including it, and the method for manufacturing a component built-in module of the present invention, the component built-in module is formed such that the resin that seals the top surface (one side) of the substrate is bonded to the reinforcing plate provided on the bottom surface side of the substrate. As a result, separation between the substrate and the resin (sealing resin) can be prevented.

Moreover, in an exemplary embodiment of the present invention, this type of component built-in module serves as at least a part of the casing of the electronic device. That is to say, the plurality of electronic components of the component built-in module are embedded within the casing of the electronic device. With this configuration, further low-profiling of the electronic device can be realized.

As a result, it is possible to provide a highly reliable component built-in module and an electronic device including it while low-profiling can be achieved and separation between the substrate and the resin can be prevented.

EMBODIMENTS FOR CARRYING OUT THE INVENTION

First Exemplary Embodiment

Hereunder, a component built-in module according to an exemplary embodiment of the present invention, an electronic device including it, and a method for manufacturing a component built-in module are described, with reference to FIG. 1 through FIG. 4E. The present exemplary embodiment relates to a component built-in module to be equipped in an electronic device that requires low-profiling such as a mobile phone, an electronic device, and a method for manufacturing a component built-in module.

Figure 1:
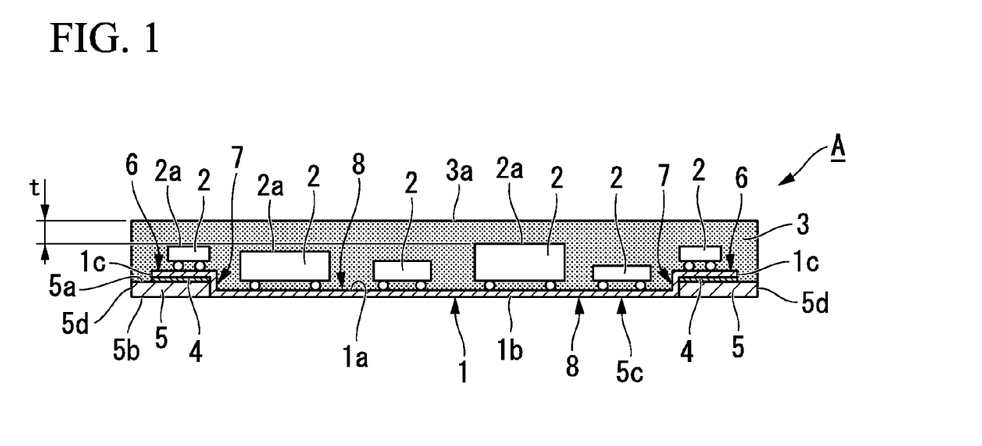
FIG. 1 is a sectional view showing a component built-in module according to an exemplary embodiment of the present invention.

As shown in FIG. 1, a component built-in module A of the present exemplary embodiment includes: a substrate (wiring substrate) 1, a plurality of electronic components 2, a resin 3, and a reinforcing plate 5. The substrate 1 is for example a flexible substrate. The substrate 1 has a top surface (mounting surface) 1a and a bottom surface 1b on the opposite side to the top surface 1a. The plurality of electronic components 2 are mounted on the top surface 1a of the substrate 1. The resin 3 seals the top surface 1a of the substrate 1 (and the plurality of electronic components 2). The reinforcing plate 5 is bonded to the bottom surface 1b of the substrate 1 with an adhesive agent 4 so as to be provided integrally with the substrate 1.

The plurality of electronic components 2 may be memory chips, LEDs, RFIDs, temperature sensors, or acceleration sensors. In the present exemplary embodiment, as these electronic components 2, there are used several types of electronic components 2 each having a different mount height from the mounting surface 1a to the component top surface 2a thereof in a state of being mounted on the mounting surface 1a of the substrate 1. That is to say, several electronic components 2 of different thicknesses, for example, 0.2 mm, 0.4 mm, 0.6 mm, and 0.8 mm, are mounted on the substrate 1.

The substrate 1 is preferably of a flexible material such as a polyimide substrate with an approximate thickness of 0.05 mm to 0.2 mm. The substrate 1 of the present exemplary embodiment has a square plate shape. The substrate 1 includes a bonding part 6 and a concave part (corresponding part) 8. The bonding part 6 is of a square frame shape and is provided on the outer peripheral edge 1c to be bonded to the reinforcing plate 5. The concave part 8 is provided on the inner side portion of the substrate 1 surrounded by the bonding part 6, and is concaved from the inner peripheral edge of the bonding part 6 via a step part 7. At least on the top surface 1a of the concave part 8 of the substrate 1, there are mounted a plurality of electronic components 2. In the present exemplary embodiment, electronic components 2 are mounted also on the top surface 1a of the bonding part 6. The electronic components 2 are mounted on the bonding part 6 and on the concave part 8 so that the height of the upper surface 2a of the electronic component 2 mounted on the top surface 1a of the bonding part 6 becomes less than or equal to the height of the highest upper surface 2a of the several electronic components 2 mounted on the concave part 8.

As the resin 3 that seals the top surface 1a, an acrylic, an ABS, a PC, an epoxy resin, a urethane resin, or a silicon resin are used depending on the desired purpose.

In the present exemplary embodiment, the entire surface of the top surface 1a of the substrate 1 is sealed with the resin 3. In the resin (resin layer) 3 of the present exemplary embodiment, the top surface 3a is formed flat. It is formed so that a distance t between the top surface 3a of the resin 3, and the upper surface 2a of the electronic component 2 that has the shortest distance from the top surface 3a of the resin 3 to the upper surface 2a of the electronic component 2, becomes 0.2 mm or greater. In the case where a light emitting device such as an LED is mounted as the electronic component 2, it is preferable that a transparent resin 3 is used, from the aspect of optical transparency.

Figure 2:
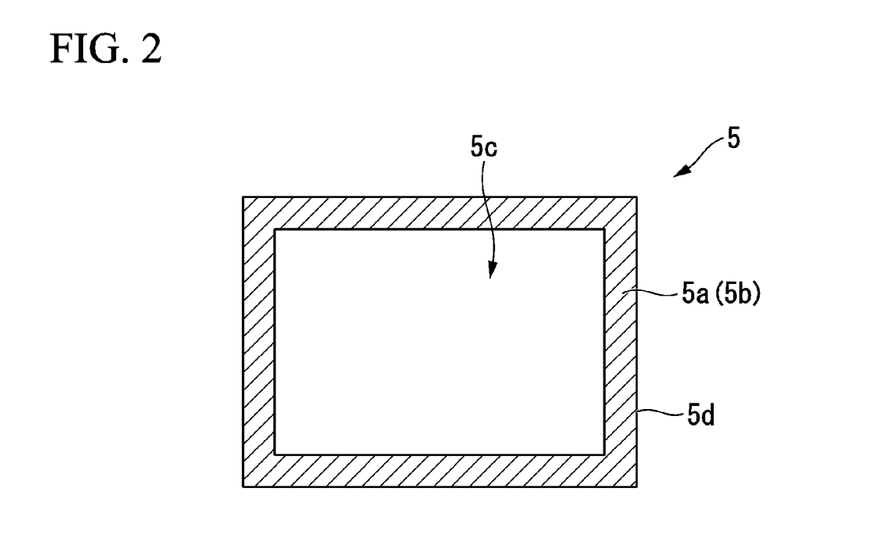
FIG. 2 is a plan view showing a reinforcing plate of the component built-in module according to the exemplary embodiment of the present invention.

The reinforcing plate 5 of the present exemplary embodiment is of a square frame shape, and has an opening part 5c as shown in FIG. 1 and FIG. 2. The opening part 5c passes through from the first surface 5a to the second surface 5b on the opposite side to the first surface 5a. This reinforcing plate 5 is attached integrally to the substrate 1 in a manner such that the first surface 5a is bonded to the bottom surface 1b of the connection part 6 of the substrate 1 with the adhesive agent 4 while the opening part 5c is engaged with the concave part 8 of the substrate 1 (the portion of the substrate 1 corresponding to the opening part 5c). At this time, the reinforcing plate 5 and the concave part 8 of the substrate 1 are formed so that the bottom surface 1b of the concave part 8 engaged with the opening part 5c and the second surface 5b of the reinforcing plate 5 are arranged on the same plane. With the bottom surface 1b of the concave part 8 of the substrate 1 and the second surface 5b of the reinforcing plate 5 being arranged on the same plane in this manner, it is possible to attach the reinforcing plate 5 to the component built-in module A without increasing the thickness of the component built-in module A and without limiting the region of the substrate 1 where components can be mounted.

The outer dimension of the reinforcing plate 5 is greater than that of the substrate 1. The reason for this is to make a configuration such that the outer peripheral edge 5d of the reinforcing plate 5 is arranged on the outer side of the outer peripheral edge 1c (the outer peripheral edge 1c of the connection part 6) of the substrate 1 while the reinforcing plate 5 is in a state of being attached to the substrate 1. By forming the reinforcing plate 5 in this way, the component built-in module A of the present exemplary embodiment is formed such that the resin 3 that seals the top surface 1a of the substrate 1 is bonded to the first surface 5a of the reinforcing plate 5 on the outer peripheral edge 5d side.

At this time, the bonding width of the resin 3 and the reinforcing plate 5 is preferably equal to or more than 2 mm. For example, in the case where the outer dimension of the reinforcing plate 5 is 30×60 mm, the outer dimension of the substrate 1 is made 26×56 mm. With this structure, the reinforcing plate 5 and the resin 3 can be directly bonded to each other with a width of 2 mm per one edge. As a result, it is possible to prevent the substrate 1 from being separated from the edge part of the resin 3. It is also possible to bond a plurality of substrates 1 to a single reinforcing plate 5.

From the aspect of bondability with the resin 3 that seals the top surface 1a of the substrate 1, it is preferable that the reinforcing plate 5 is formed with use of a resin of the same material (same type) as that of this resin 3. The reinforcing plate 5 may be formed such that a metal material is coated with a resin of the same material. This metal material is not particularly limited, however stainless steel is preferred. The preferred thickness of the reinforcing plate 5 is approximately 0.1 mm to 0.5 mm.

Figure 3:
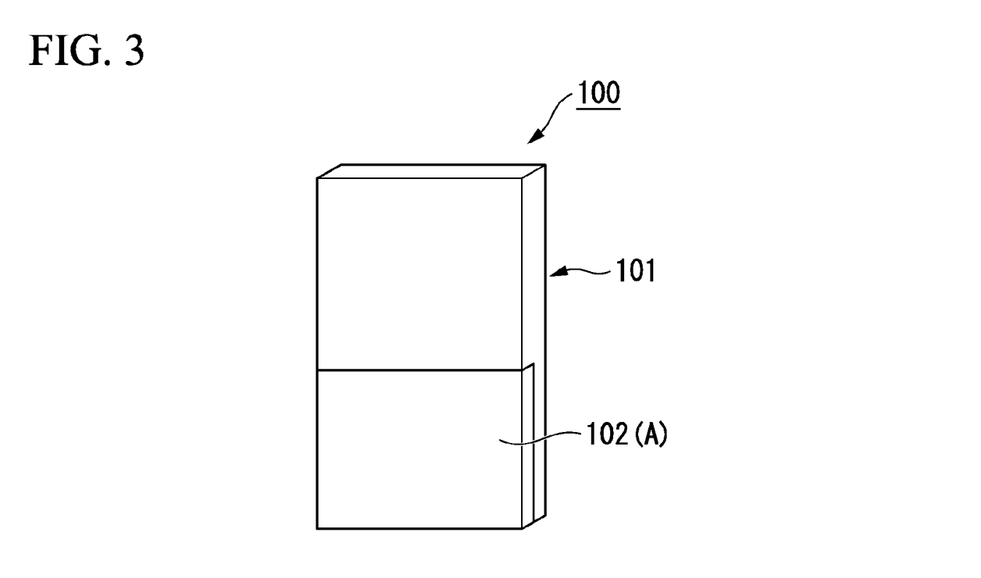
FIG. 3 is a perspective view showing a mobile phone including the component built-in module according to the exemplary embodiment of the present invention.

Examples of the electronic device of the present exemplary embodiment including the component built-in module A above include a mobile phone. This electronic device is configured with a casing including an upper casing and a lower casing, and a component built-in module A including a plurality of electronic components 2, built into the interior of the casing. Moreover, the electronic device of the present exemplary embodiment is configured such that the above component built-in module A is built into a part of the battery cover or the casing top surface. With this type of configuration, it is possible to reduce space for the casing of the electronic device and realize low-profiling. Furthermore, in the case of this type of configuration, by replacing the component built-in module A, it is possible to easily change the functions of the electronic device. FIG. 3 shows a casing 101 of a mobile phone 100 of the present exemplary embodiment. A component built-in module A is built into a battery cover 102, which is part of this casing 101.

Next, there is described a method for manufacturing a component built-in module A of the present exemplary embodiment having the above configuration.

Figure 4A:
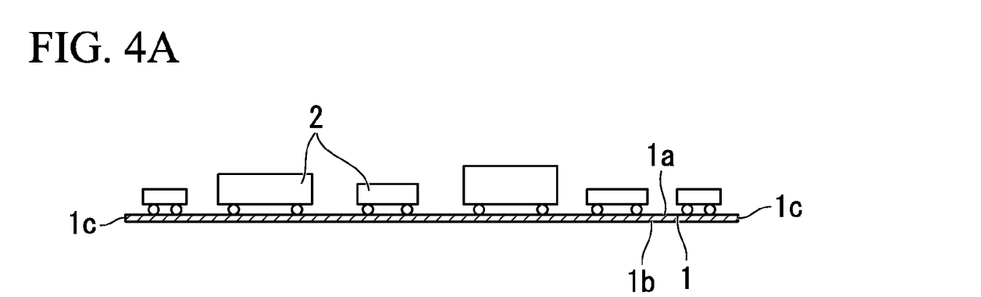
FIG. 4A is a diagram showing a method for manufacturing a component built-in module according to the exemplary embodiment of the present invention.
Figure 4B:
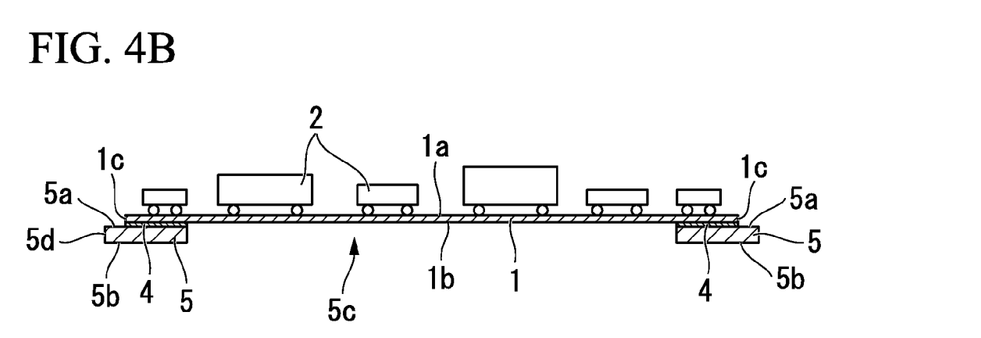
FIG. 4B is a diagram showing the method for manufacturing a component built-in module according to the exemplary embodiment of the present invention.

When manufacturing a component built-in module A of the present exemplary embodiment, as shown in FIG. 4A, first, a plurality of electronic components 2 are mounted on the top surface 1a of a flat plate-shaped substrate (flexible substrate) 1 (electronic component mounting step). Next, as shown in FIG. 4B, the bottom surface 1b of the substrate 1 is bonded to a reinforcing plate 5 with an adhesive agent 4 (reinforcing plate bonding step).

Figure 4C:
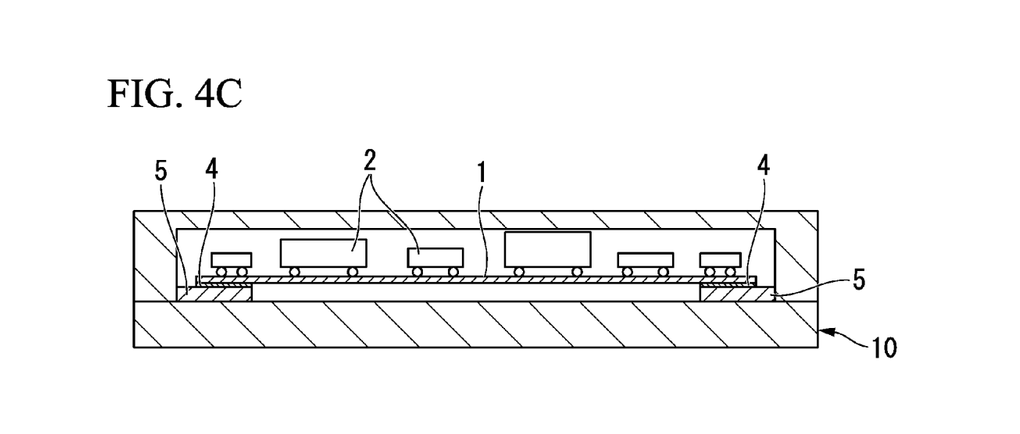
FIG. 4C is a diagram showing the method for manufacturing a component built-in module according to the exemplary embodiment of the present invention.

Then, as shown in FIG. 4C, the substrate 1 in state of having the electronic components 2 mounted thereon is installed on a metal mold 10 in order to seal the substrate 1 with a resin 3. In the case of using a thermoplastic resin such as acrylic, ABS, or PC as the resin 3 for sealing the substrate 1, the preferred temperature of the metal mold 10 is approximately 80° C.

Figure 4D:
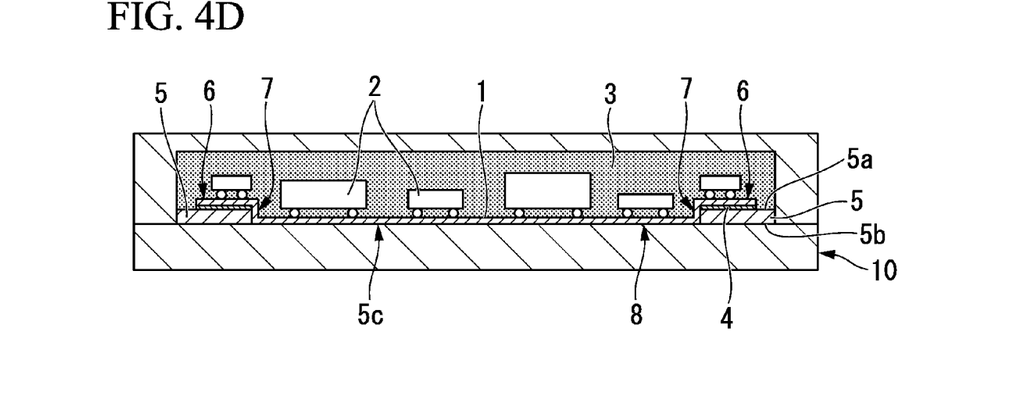
FIG. 4D is a diagram showing the method for manufacturing a component built-in module according to the exemplary embodiment of the present invention.

As shown in FIG. 4D, the metal mold 10 is clamped, and the resin 3 is injected into the metal mold 10 (resin sealing step). At this time, the injection pressure of the resin 3 causes the substrate 1 to deform along the reinforcing plate 5 and a concave part 8 (step part 7) that engages with the opening part 5c is formed, and at the same time, the electronic components 2 are accommodated within the concave part 8. As a result, the top surface 1a of the substrate 1 is sealed with the resin 3. In the present exemplary embodiment, the concave part 8 can be formed by including the concave part formation step in the resin sealing step (through a single step).

Figure 4E:
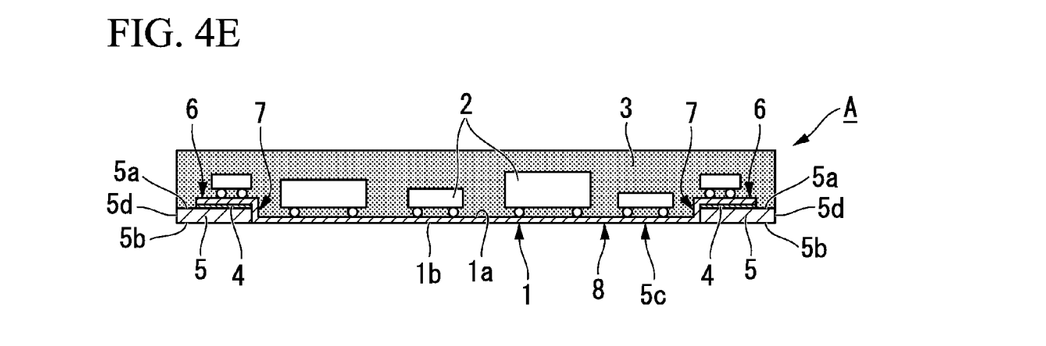
FIG. 4E is a diagram showing the method for manufacturing a component built-in module according to the exemplary embodiment of the present invention.

Lastly, as shown in FIG. 4E, the resin-sealed substrate 1 is taken out from the metal mold 10 to thereby complete the component built-in module A of the present exemplary embodiment.

The above example illustrates the injection molding technique as a resin sealing technique, however, it is not limited to this technique. The sealing technique can be selected according to the resin 3 to be used. For example, when a thermoplastic resin is selected, an injection molding technique may be performed. Moreover, when a thermosetting resin is selected, the resin sealing may be performed by means of a transfer molding technique. It is also possible to improve the design by forming a decorating sheet or a paint coating film on the resin top surface after the resin-sealed substrate 1 has been taken out from the metal mold 10.

Therefore, in the component built-in module A, the electronic device including it, and the method for manufacturing a component built-in module A of the present exemplary embodiment, the resin 3 that seals the top surface 1a of the substrate 1 is bonded to the first surface 5a of the outer peripheral edge 5d of the reinforcing plate 5, to form a component built-in module A. As a result, the edge surface 1c of the substrate 1 is built into the resin 3, and it becomes possible to prevent the edge part 1c of the substrate 1 from being separated from the sealing resin 3.

Moreover, the reinforcing plate 5 is formed with use of a resin of the same material (same type) as the resin 3 that seals the top surface 1a of the substrate 1. Alternatively, the reinforcing plate 5 is formed such that a metal material is coated with a resin of the same material. As a result, it is possible to ensure a sufficient level of bondability between the resin 3 that seals the top surface 1a of the substrate 1 and the reinforcing plate 5, and reliably prevent separation between the substrate 1 and the resin 3.

Furthermore, the reinforcing plate 5 has an opening part 5c. In addition, it is attached integrally in a manner such that the first surface 5a is bonded to the bottom surface 1b of the connection part 6 of the substrate 1 with the adhesive agent 4, while the opening part 5c is engaged with the concave part 8 of the substrate 1 (the portion of the substrate 1 corresponding to the opening part 5c). Furthermore, the reinforcing plate 5 and the concave part 8 of the substrate 1 are formed so that the bottom surface 1b of the concave part 8 engaged with the opening part 5c and the second surface 5b of the reinforcing plate 5 are arranged on the same plane. As a result, even in the case where the reinforcing plate 5 is attached to the component built-in module A, the thickness of the component built-in module A will not be increased, and the region of the substrate 1 where components can be mounted will not be limited.

Moreover, the configuration is such that this type of component built-in module A serves at least as a part of the casing of the electronic device, that is to say, such that several electronic components 2 of the component built-in module A are embedded within the casing of the electronic device. With this configuration, further low-profiling of the electronic device can be realized.

Therefore, according to the component built-in module A, the electronic device including it, and the method for manufacturing a component built-in module A of the present exemplary embodiment, it is possible to provide a highly reliable component built-in module A capable of preventing separation of the resin 3 from the substrate 1 while achieving low-profiling, and an electronic device including it.

One exemplary embodiment of the component built-in module, the electronic device including it, and the method for manufacturing a component built-in module according to the present invention has been described. However, the present invention is not limited to the above exemplary embodiment, and various modifications may be made thereto without departing from the scope of the invention.

Figure 5A:
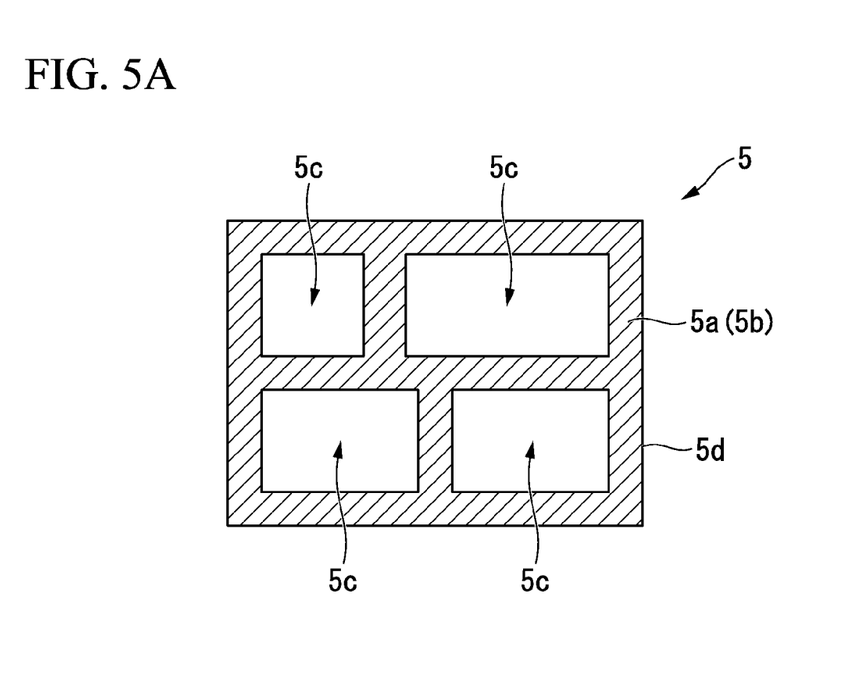
FIG. 5A is a plan view showing a modified example of the reinforcing plate of the component built-in module according to the exemplary embodiment of the present invention.
Figure 5B:
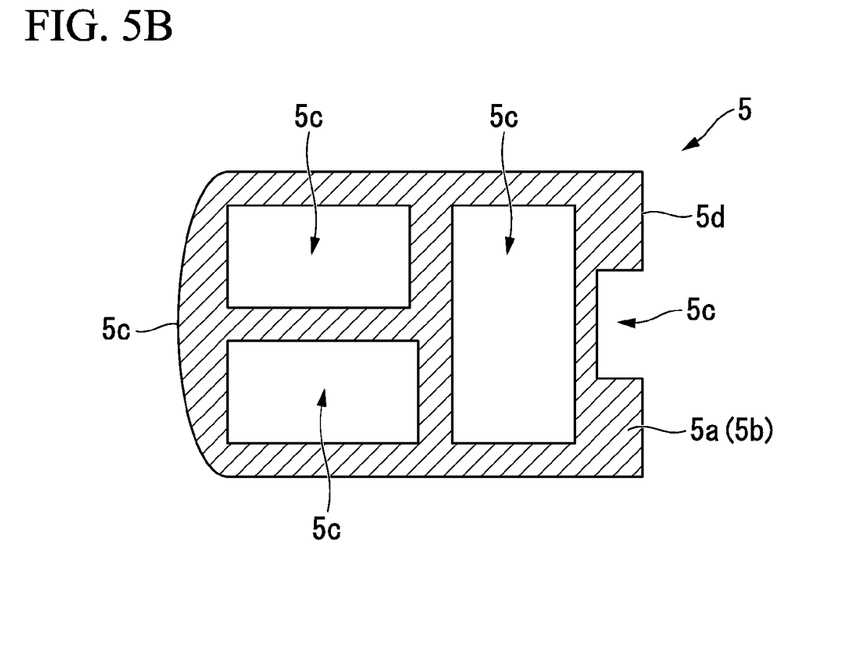
FIG. 5B is a plan view showing a modified example of the reinforcing plate of the component built-in module according to the exemplary embodiment of the present invention.

For example, in the present exemplary embodiment, the reinforcing plate 5 includes a single square frame-shaped opening part 5c. However, it is not limited to this configuration. As shown in FIG. 5A and FIG. 5B, the reinforcing plate 5 may include a plurality of opening parts 5c, or the reinforcing plate 5 may be formed with an outer shape other than a square shape. Moreover, the opening part 5c may be formed with a shape other than a rectangular shape such as triangular shape or a circular shape. Furthermore, the reinforcing plate 5 may include a plurality of opening parts 5c of different forms and sizes.

In the present exemplary embodiment, FIG. 1 shows that the side surface that forms the opening part 5c of the reinforcing plate 5 is in close contact with the step part 7 of the substrate 1. However, it is not particularly limited to this configuration where the side surface that forms the opening part 5c of the reinforcing plate 5 is in close contact with the step part 7 of the substrate 1.

Figure 6:
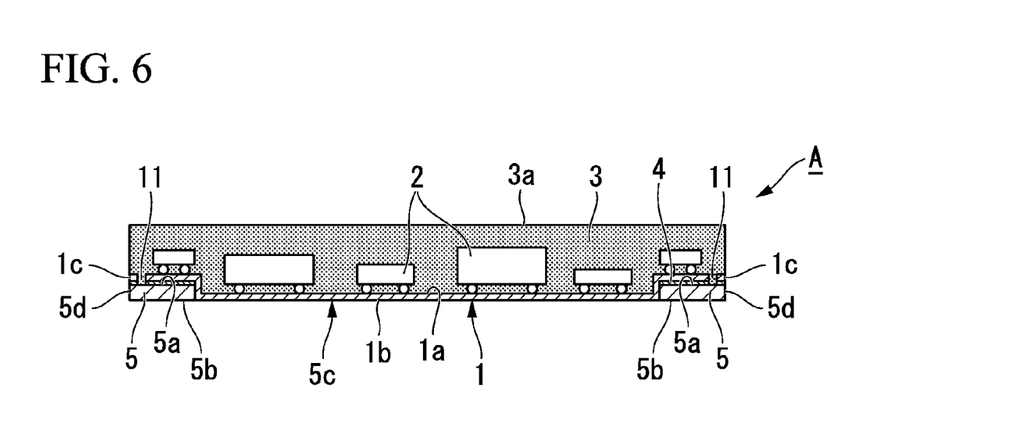
FIG. 6 is a sectional view showing a modified example of the component built-in module according to the exemplary embodiment of the present invention.

As shown in FIG. 6, through holes 11 may be provided in the substrate 1 to thereby bring the resin 3 into direct bonding with the reinforcing plate 5 through these through holes 11. In this case, it is possible to prevent separation between the resin 3 and the substrate 1. In addition, compared to the case of bonding the resin 3 with the reinforcing plate 5 on the outer peripheral edge side of the component built-in module A as seen in the present exemplary embodiment, it is possible to reduce the size of the component built-in module A.

Figure 7:
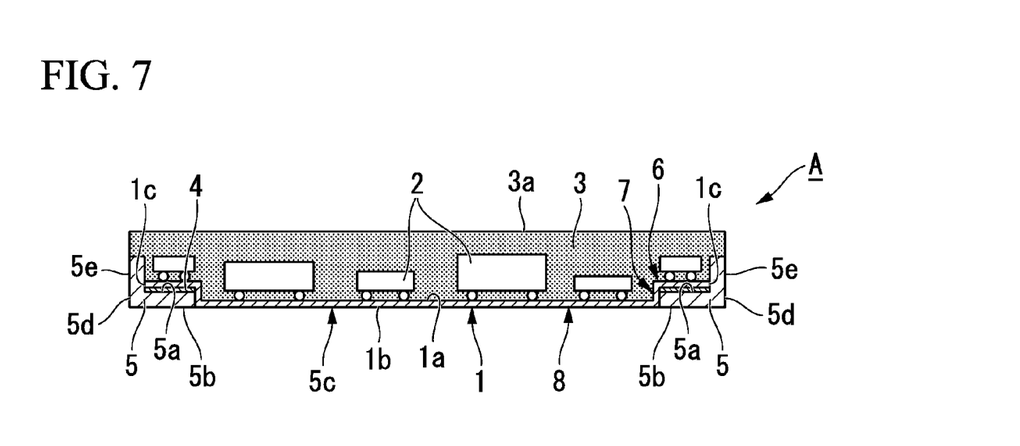
FIG. 7 is a sectional view showing a modified example of the component built-in module according to the exemplary embodiment of the present invention.

As shown in FIG. 7, a part of the reinforcing plate 5 may be bent up from the bottom surface 1b side of the substrate to the top surface 1a side to thereby form bent parts 5e. In this case, the moment of inertia of area can be made large, and it is possible to obtain an effect of suppressing warpage of the component built-in module A.

Figure 8A:
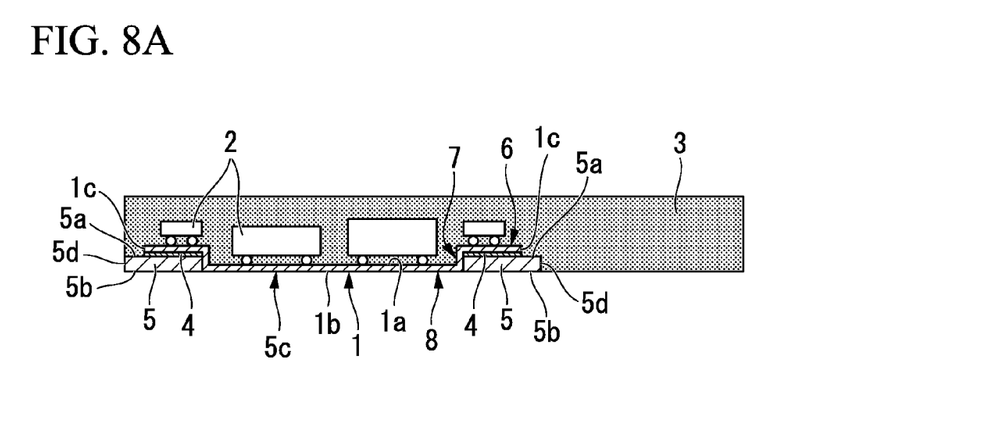
FIG. 8A is a sectional view showing a modified example of the component built-in module according to the exemplary embodiment of the present invention.
Figure 8B:
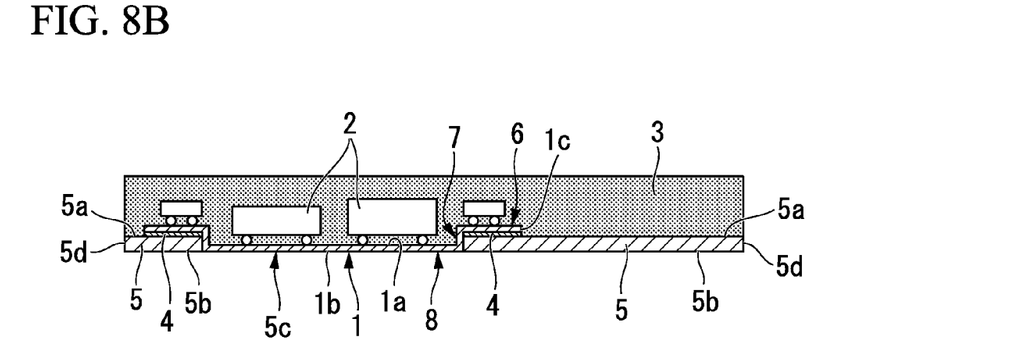
FIG. 8B is a sectional view showing a modified example of the component built-in module according to the exemplary embodiment of the present invention.

The component built-in module A may be configured such that the reinforcing plate 5 is provided in one portion on the bottom surface side of the component built-in module A as shown in FIG. 8A, or the reinforcing plate 5 is significantly extended outward from the outer peripheral edge 1c of the substrate 1 (so that the substrate 1 is bonded to one portion of the reinforcing plate 5) as shown in FIG. 8B.

Figure 9:
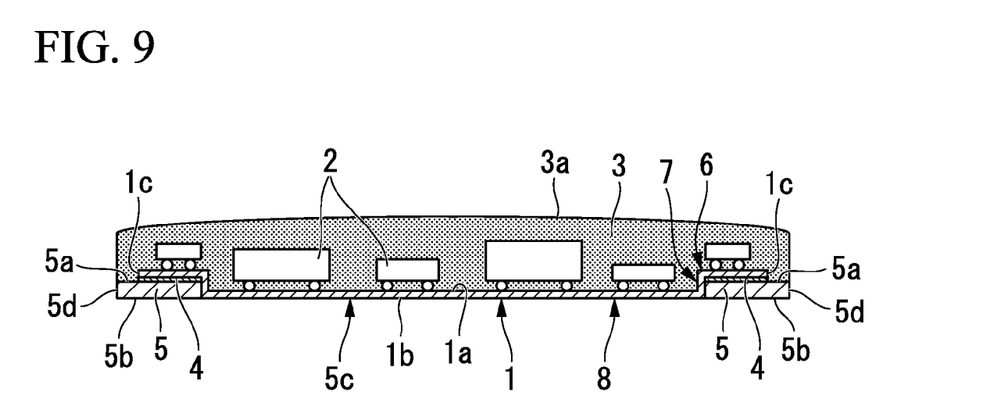
FIG. 9 is a sectional view showing a modified example of the component built-in module according to the exemplary embodiment of the present invention.

The top surface (sealing surface) of the resin 3 need not be flat, and it may be freely changed depending on the design of the electronic device into which the component built-in module A is incorporated. For example, as shown in FIG. 9, the top surface 3a of the resin 3 may be formed in a curved surface shape.

This application is based upon and claims the benefit of priority from Japanese patent application No. 2010-232321, filed Oct. 15, 2010, the disclosure of which is incorporated herein in its entirety by reference.

INDUSTRIAL APPLICABILITY

The present invention may be applied to a component built-in module, an electronic device including it, and a method for manufacturing a component built-in module. According to the component built-in module, electronic device including it, and the method for manufacturing a component built-in module, it is possible to prevent separation between the substrate and the resin while achieving low-profiling.

REFERENCE SYMBOLS

1 Substrate
1a Top surface (mounting surface)
1b Bottom surface
1c Outer peripheral edge (edge part)
2 Electronic component
2a Upper surface
3 Resin
3a Top surface
4 Adhesive agent
5 Reinforcing plate
5a First surface
5b Second surface
5c Opening part
5d Outer peripheral edge
6 Connection part
7 Step part
8 Concave part (corresponding part)
10 Metal mold
11 Through hole
100 Mobile phone (electronic device)
101 Casing
102 Battery cover
A Component built-in module

What is claimed is:

1. A component built-in module comprising:
   a substrate which includes a top surface and a bottom surface;
   a plurality of electronic components which are mounted on the top surface of the substrate;
   a resin which seals the top surface of the substrate; and
   a reinforcing plate which is bonded to the bottom surface of the substrate, the reinforcing plate and the resin being bonded to each other;

wherein the reinforcing plate includes a first surface, a second surface on an opposite side to the first surface, and an opening part which passes through from the first surface to the second surface;

wherein one part of the substrate is a corresponding part which corresponds to the opening part; and wherein the corresponding part engages with the opening part from a side of the first surface, and the bottom surface of the substrate at the corresponding part is arranged flush with the second surface of the reinforcing plate.

2. The component built-in module according to claim 1 wherein the electronic components are mounted at least on the top surface of the substrate at the corresponding part.

* * * * *